United States Patent [19]

Neppl et al.

[11] Patent Number: 4,761,384
[45] Date of Patent: Aug. 2, 1988

[54] FORMING RETROGRADE TWIN WELLS BY OUTDIFFUSION OF IMPURITY IONS IN EPITAXIAL LAYER FOLLOWED BY CMOS DEVICE PROCESSING

[75] Inventors: Franz Neppl, Munich; Erwin Jacobs, Vaterstetten; Josef Winnerl, Landshut; Carlos-Alberto Mazure-Espejo, Kirchseeon, all of Fed. Rep. of Germany

[73] Assignee: Siemens Aktiengesellschaft, Berlin & Munich, Fed. Rep. of Germany

[21] Appl. No.: 55,377

[22] Filed: May 29, 1987

[30] Foreign Application Priority Data

Jun. 10, 1986 [DE] Fed. Rep. of Germany ....... 3619506

[51] Int. Cl.$^4$ .......................................... H01L 21/265
[52] U.S. Cl. ..................................... 437/029; 357/42; 357/91; 437/31; 437/34; 437/56; 437/97; 437/98; 148/DIG. 82
[58] Field of Search .................. 437/29, 31, 34, 56, 437/97, 98; 357/42, 91

[56] References Cited

U.S. PATENT DOCUMENTS

| | | | |
|---|---|---|---|
| 4,128,439 | 12/1978 | Jambotkar | 437/97 |
| 4,168,997 | 9/1979 | Compton | 437/98 |
| 4,379,726 | 4/1983 | Kumamaru et al. | 437/34 |
| 4,435,896 | 3/1984 | Parrillo et al. | 437/34 |
| 4,466,171 | 8/1984 | Jochems | 437/34 |
| 4,529,456 | 7/1985 | Anzai et al. | 437/31 |
| 4,536,945 | 8/1985 | Gray et al. | 437/29 |

OTHER PUBLICATIONS

Rung et al, IEEE Trans. Electron Devices, ED-28 (1981) 1115.

Primary Examiner—Upendra Roy
Attorney, Agent, or Firm—Hill, Van Santen, Steadman & Simpson

[57] ABSTRACT

A method for the manufacture of LSI complementary MOS field effect transistor circuits to increase the latch-up hardness of the n-channel and p-channel field effect transistors while retaining good transistor properties by incorporating a further epitaxial layer and highly doped implantation regions into a lower epitaxial layer from which the wells are generated by out-diffusion into the upper epitaxial layer. In addition to achieving optimum transistor properties, the reduced lateral diffusion provided enables a lower $n^+/p^+$ spacing, and thus achieves a higher packing density with improved latch-up hardness.

16 Claims, 5 Drawing Sheets

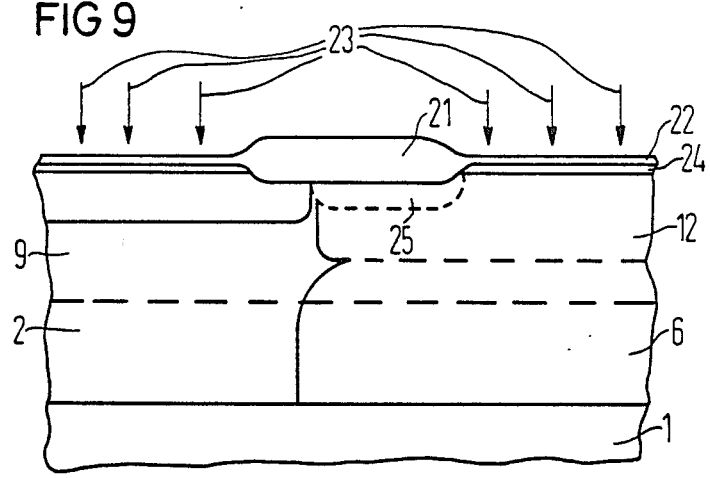
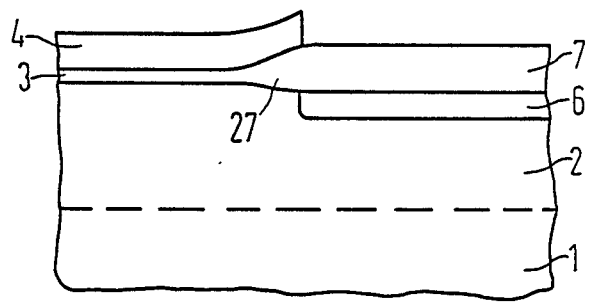
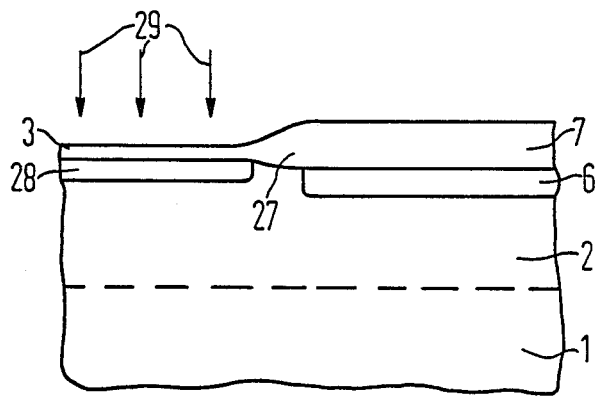

FORMING RETROGRADE TWIN WELLS BY OUTDIFFUSION OF IMPURITY IONS IN EPITAXIAL LAYER FOLLOWED BY CMOS DEVICE PROCESSING

BACKGROUND OF THE INVENTION

1. Field of the Invention

The present invention is directed to a method for the manufacture of LSI, complementary MOS field effect transistor circuits wherein p-doped or n-doped wells are generated in the semiconductor substrate for the formation of n-channel or p-channel transistors. The required dopants are introduced into the wells by ion implantations in order to set the various transistor threshold voltages. An n+-doped or p+-doped silicon having an n−-doped or p−-doped epitaxial layer situation on the substrate is employed as the semiconductor substrate. The manufacture of the source/drain and gate regions as well as the generation of intermediate and insulating oxides plus formation of the interconnect levels are performed in accordance with the known method steps of MOS technology.

2. Description of the Prior Art

An overall method for producing LSI complementary MOS field effect transistor circuits may be found, in general, in European Patent Application No. 0 135 163.

Modern CMOS processes employ technologies wherein both the n- as well as p-channel transistors occur in wells. Setting the various transistor threshold voltages of thin oxide transistors and field oxide transistors of both types is accomplished by multiple ion implantations. An increased latch-up hardness, i.e., suppression of the parasitic bipolar effects was previously obtained either by employing an epitaxial layer on a low impedance substrate or by employing a "retrograde well".

The use of an epitaxial layer in a CMOS process is disclosed in an article by L.C. Parillo et al. in Technical Digest IEDM 1980, 29.1, pages 752 through 755. The two n-doped or p-doped wells are produced in a CMOS process by means of self-adjusting process steps through the use of a mask. The self-adjusting implantation of the two wells leads to a substantial local overlap and charge compensation of the n-implanted or p-implanted regions at the implantation edge using the standard depth of 5 microns of the n-well or p-well. The effect thereof is that the threshold voltage of the field oxide transistor is reduced and the current gain of the parasitic npn and pnp bipolar transistors is increased, thus leading to increase latch-up susceptibility.

Another method which uses an epitaxial layer for increasing the latch-up hardness is described in European Patent Application No. 0 135 163. In this method, the threshold voltages of the n-channel and p-channel CMOS field effect transistors are set by specific gate materials and adjusted by gate oxide thicknesses as well as by a specific channel implantation.

Both described methods have the disadvantage that the sheet resistance of the p-well is in the region of a number of kilo-ohms per square, thus reducing the latch-up susceptibility but not making it impossible. Moreover, the sensitivity of the MOS FET located in the well relative to substrate currents is relatively high.

The employment of a "retrograde well" in a CMOS process is known from an article by R.D. Rung et al. in IEEE Transactions on Electron Devices, vol. ED-28, no 10, October 1981, pages 1115 through 1119. In this method, a p- or n-well profile having an increasing doping in the depth is produced by employing a deep implantation with a short diffusion step following. A shallower well is produced not affecting the sheet resistance and reducing the n+/p+ spacing to about one-third its former value. A disadvantage of this method is in the necessity of adding expensive technology in the form of high energy implantation.

SUMMARY OF THE INVENTION

The present invention solves the problem of suppressing the parasitic bipolar effects and, thus, increases the latch-up hardness by the following series of steps. There is provided an n+-doped or p+-doped silicon substrate having a second n−-doped or p−-doped epitaxial layer additional to a first n−-doped or p−-doped epitaxial layer. Buried layers are implanted with relatively high dosage into the deeper, first epitaxial layer where later the well regions will be formed and a second or upper epitaxial layer is disposed thereabove. The wells are generated by outward diffusion from these highly doped buried layers into the second epitaxial layer and, under certain conditions, by diffusion of ions implanted into the second expitaxial layer.

Since the well is produced by diffusion from the highly doped "buried layers" into the upper, epitaxial layer and, under certain conditions, by diffusion of a well doping implanted into the upper epitaxial layer which provides a light doping in comparison to the highly doped buried layer, the product of diffusion constant times time required for the well generation with a given well depth can be greated reduced. Beyond this, the well and epitaxial layer doping at the surface and along its depth can be set independently of one another so that these dopings can be controlled to the demands made of the transistor and of the latch-up hardness.

The following advantages can be achieved by practicing the method of the present invention due to the reduced product of diffusion constant times time:
(a) fewer crystal defects;
(b) a lower dopant diffusion from the highly doped substrates;
(c) no special equipment for high temperature treatment about 1000° C. as previously required;
(d) a shorter, common drive-in time for both wells;
(e) a lower lateral diffusion and compensation of the surface regions despite self-adjusted wells; and
(f) reduction of the spacing between the wells and the epitaxial layer edge as a result of the steeper well profile.

The employment of the "buried layer" permits:
(a) a lower well resistivity and, thus, an improved latch-up hardness without deterioration of the transistor characteristics;
(b) a flat well with constant parasitic collector-emitter breakdown voltage;
(c) no mobility reduction due to high dopings in the channel region;
(d) no complicated or costly high energy implantation; and
(e) fewer well contacts.

Due to the reduced lateral diffusion or the steeper well profile, a smaller n+/p+spacing is allowed. Together with the lower number of well contacts required, a higher packing density with improved latch-up hardness is achieved.

BRIEF DESCRIPTION OF THE DRAWINGS

Two process sequences for the manufacture of a CMOS circuit in accordance with the teachings of the present invention are set forth in greater detail with reference to FIGS. 1 through 17. The process sequences are set forth with a p-well process which is constructed on n-doped silicon substrate material. Obviously, the same process sequences can be transferred to an n-well process based on p-silicon substrate material.

FIGS. 1 through 9 show cross sections through the structures achieved by the individual method steps, with a number of process steps being shown combined at each Figure for the sake of simplicity;

FIGS. 10 through 14 show another process sequence wherein the production of both wells occurs by diffusion out from buried layers;

DESCRIPTION OF THE PREFERRED EMBODIMENTS

Figure 1:
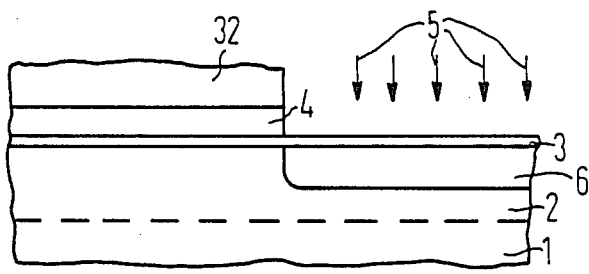

In the first embodiment, starting with FIG. 1, there is shown an n+-doped (100) oriented silicon substrate 1 having a specific resistance of 0.02 ohms·cm. A first n-doped epitaxial layer 2 having a layer thickness of about 3 microns and a specific resistance of 0.05 ohms·cm is formed on the substrate 1. A double layer 3, 4 composed of $SiO_2$ measuring about 50 nm, and silicon nitride measuring 140 nm is provided over the epitaxial layer 2. The silicon nitride layer 4 is covered with a photoresist mask 32 over the later formed n-well region to keep it covered during the subsequent implantation. A highly doped, buried zone 6 is then produced in the surface regions which are to later constitute the p-well regions which are not covered by the photoresist layer 32 and the silicon nitride layer 4. The buried zone 6 can be produced by a boron ion implantation illustrated at reference numeral 5, and having a dosage of $1 \times 10^{14}$ cm$^{-2}$ and at an energy level of 25 keV. The connection to the p-well is then produced from this zone 6 by outward diffusion in the later steps of the process. The zone 6 leads to the reduction of the resistance of the p-well and to an increase in the collector-emitter breakdown voltage.

Figure 3:
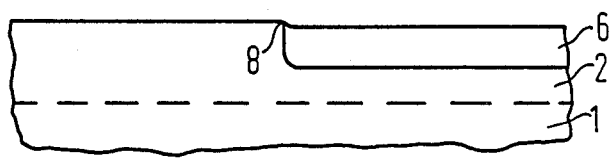

After removal of the photoresist mask 32, an $SiO_2$ layer 7 up to 200 nm in thickness is generated in the p-well region by oxidation of the surface, thereby forming a structure edge 8. FIG. 3 shows the arrangement after the removal of the silicon nitride mask 4 and the oxide layer 3, 7.

Figure 4:
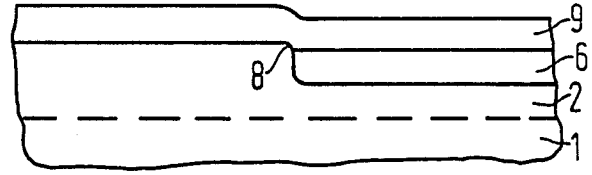

There is then deposited an n⁻-doped epitaxial layer 9 having a layer thickness on the order of 1 micron and having a specific resistance of 20 ohms·cm. This arrangement is illustrated in FIG. 4.

Figure 5:
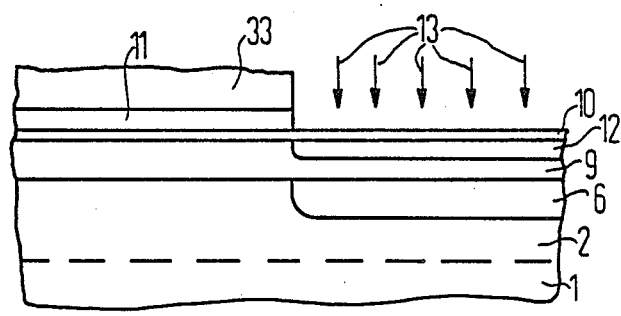

FIG. 5 illustrates the structure after the production of a further double layer 10, 11 composed of a 50 nm thick $SiO_2$ layer 10 and a 140 nm thick silicon nitride layer 11. The silicon nitride layer 11 is structured with a photoresist mask 33, thus producing a p-well 12 in the n-doped epitaxial layer 2 by boron ion implantation illustrated at reference numeral 13 having a dosage of $2 \times 10^{12}$ cm$^{-2}$ and at an energy level of 160 keV.

Figure 6:
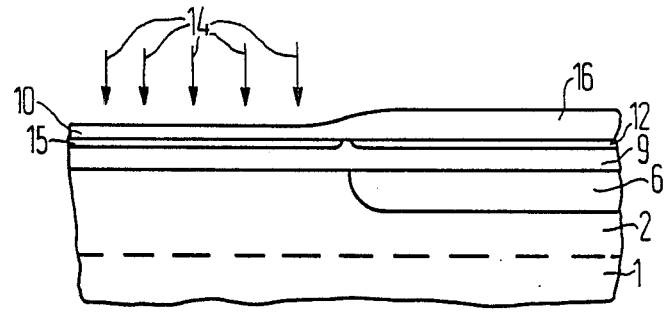

As illustrated in FIG. 6, a phosphorus ion implantation 14 at a dosage of $1 \times 10^{12}$ cm$^{-2}$ and an energy level of 180 keV is used to produce an n-well 15, an $SiO_2$ layer 16 having previously been produced over the p-well region by local thermal oxidation and the nitride mask 11 having been removed and a heat treating process having been carried out.

Figure 7:
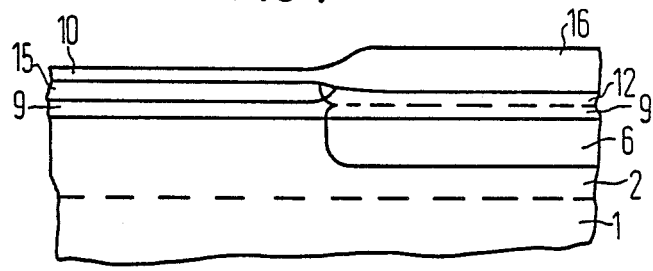

FIG. 7 illustrates the arrangement after the drive-in process for the two wells 12 and 15 which occurs at about 1000° C. from 2 to 3 hours.

After the well drive-in, there is now a connection between the p-well 12 and the p+ buried layer 6 which lies below it.

Figure 8:
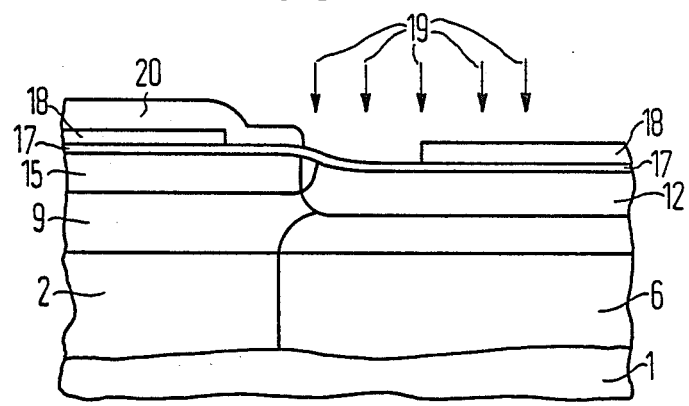

The total oxide layer 10, 16 is then removed and a double layer 17, 18 composed of 50 nm thick $SiO_2$ and 140 nm thick silicon nitride is generated as shown in FIG. 8. This step is in preparation for the local oxidation of silicon known as the LOCOS process. The silicon nitride layer 18 is structured by standard phototechnique and etching. FIG. 8 shows the arrangement during the ion implantation illustrated at reference numeral 19 of the field oxide regions of the n-channel transistors with boron ions, which occurs at a dosage of $1 \times 10^{13}$ cm$^{-2}$ and an energy level of 25 to 90 keV. The n-well region 15 is thereby covered with a photoresist mask 20. There is, thus, produced a p+-doped region 25 which provides an adequately high threshold voltage of the n-channel field oxide transistors.

After removal of the photoresist mask 20 and generation of the field oxide 21 by oxidation, using the nitride structures as oxidation masks, the oxide layer 17 shown in FIG. 8 is reoxidized by an oxidation process following the removal of the nitride mask 18. After etching off the oxide layer 17, the gate oxide 22 is generated in a predetermined layer thickness as shown in FIG. 9. A surface-wide boron ion implantation illustrated at reference numeral 23 with a dosage leve of $5 \times 10^{11}$ cm$^{-2}$ at an energy level of 25 keV produces channel doping of the p-channel and n-channel transistors and serves the purpose of setting the threshold voltages of both transistor types. After this step, the process follows conventional technology, whereby one or more channel implantations are carried out depending on the gate oxide thickness and the gate material. These processes are known and may be found in the initially cited European Patent Application No. 0 135 163.

Figure 15:
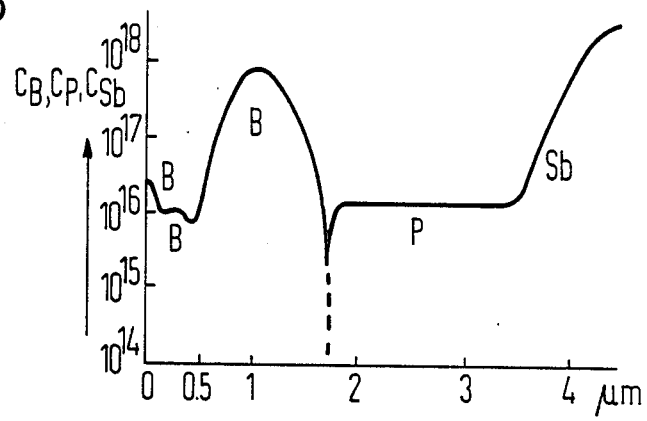
FIGS. 15 through 17 illustrate the doping profiles achieved in the active regions of the n-channel or the p-channel transistors, FIG. 15 illustrating the doping profile in the active region of the n-channel transistors of the embodiment set forth in FIGS. 1 through 9, whereas FIGS. 16 and 17 relate to the doping profile achieved in the active region of the n-channel (FIG. 16) or the p-channel (FIG. 17) transistors of the embodiment of FIGS. 10 through 14.

The doping profile achieved in the active region of the n-channel transistors of FIG. 9 is qualitatively shown in FIG. 15. The concentration of boron, phosphorous, and antimony in the first epitaxial layer is shown on the ordinate axis and the penetration depth X in microns is shown on the abscissae.

FIGS. 10 to 14 illustrate a second embodiment of the invention. This embodiment differs from the first described embodiment in that it begins with the generation of a p+ layer 6 and an n+ buried layer 28. The well implantations 13 and 14 which are used in the first embodiment are replaced by an outward diffusion of the buried layers 6, 28, and, thus, a photolithography step is eliminated. In comparison to the first example, this alternative enables an increase in the well breakdown voltage and a reduction of the well/substrate capacitance.

Figure 2:
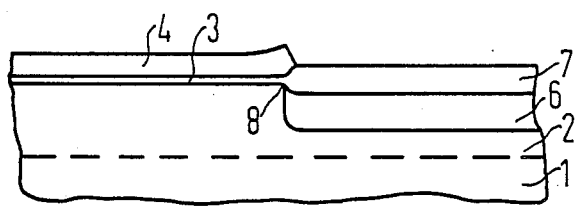

Referring to FIG. 10, the process sequence for the start of the process is analogous to that shown in FIG. 1. The oxidation of the surface for masking the buried p-layer region 6 as shown in FIG. 2 is carried out such that the oxide layer 7 is provided with a long tail 27 similar to a bird's beak for separating the two buried layers 6 and 28.

After an etching of the nitride layer 4, a phosphorous or arsenic ion implantation illustrated at reference numeral 29 is carried out at a dosage of $1 \times 10^{14}$ cm$^{-2}$ and an energy level of 40 keV to generate the buried n-doped layer 28.

Figure 12:
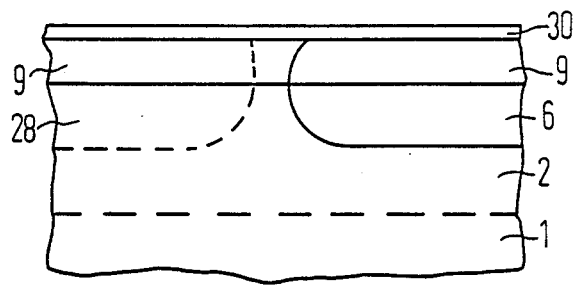

FIG. 12 illustrates the condition after etching the oxide layer 3, 7, 27 which serves as a masking, and the application of the second n$^-$-doped epitaxial layer 9 having a thickness of about 1 micron and a specific resistance of 20 ohms·cm. An insulating SiO$_2$ layer 30 is then applied over the entire surface in a layer thickness of about 50 nm. The common diffusion out from the two buried layers 6 and 28 now occurs at a temperature of about 1000° C. in a matter of 3 to 5 hours.

Figure 13:
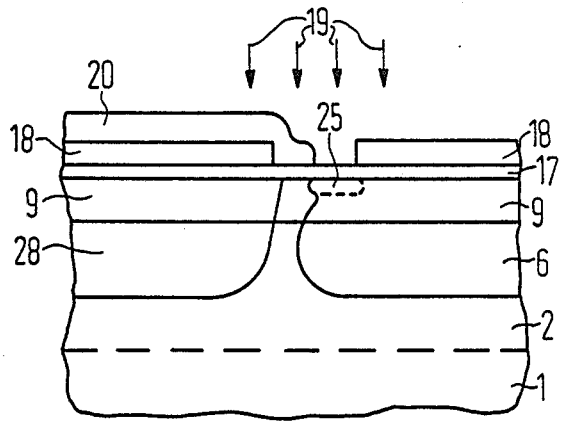
Figure 14:
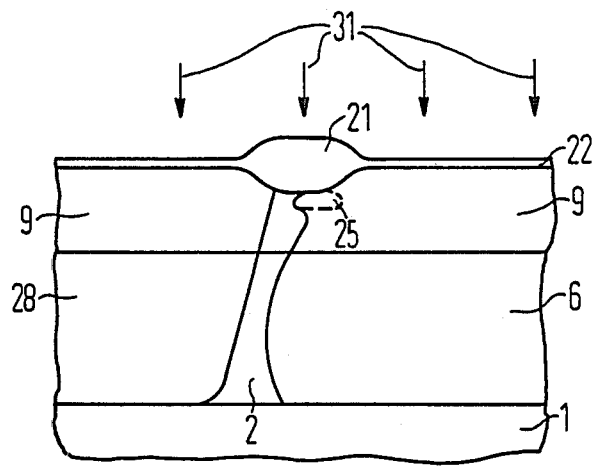

Referring next to FIG. 13, a double layer 17, 18 composed of a 50 nm thick SiO$_2$ layer and a 140 nm silicon nitride layer is now provided and is structured in preparation for the aforementioned LOCOS process. This Figure shows the arrangement after the ion implantation 19 of the regions of the n-channel field oxide transistors with boron ions at a dosage level of $1 \times 10^{13}$ cm$^{-2}$ and an energy level of 60 to 90 keV. As set forth with respect to FIG. 8, the n-well region 15 is covered with a photoresist mask 20. The p-doped region 25 is thus produced.

After the removal of the photoresist mask 20, a field oxide 21 is generated in the manner illustrated in FIG. 9. The removal of the nitride mask and the oxidation of the oxide layer 17 proceeds in an analogous manner as do all of the following process steps, as set forth with respect to FIG. 9, with the exception of the channel implantation 31. In this form of the invention, the channel implantation is carried out in two successive steps, the first being a deep boron ion implantation at a dosage of 5 to $10 \times 10^{11}$ cm$^{-2}$ and at an energy level of 60 to 120 keV. The second consists of a flat boron ion implantation at a dosage of 5 to $7 \times 10^{11}$ cm$^{-2}$ and an energy level of 25 keV. The doping of the p-channel transistors is undertaken in the same manner.

Figure 16:
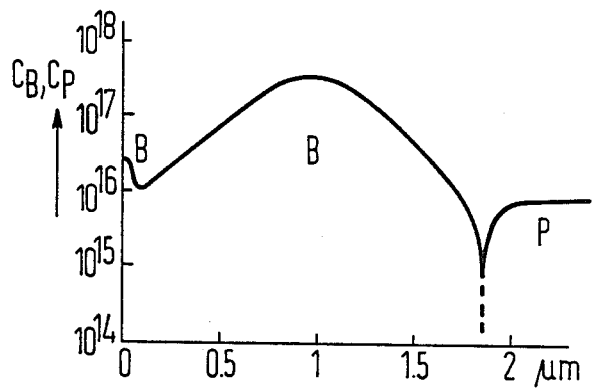
Figure 17:
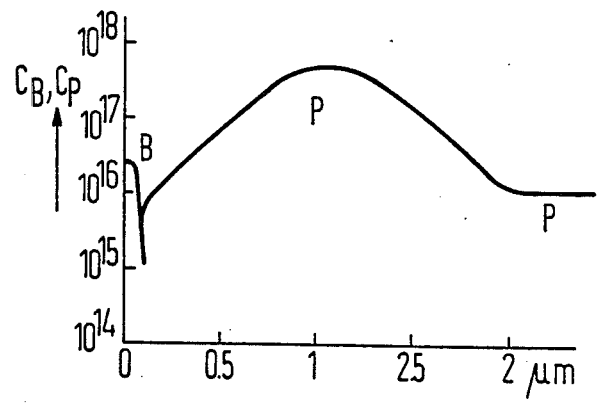

The doping profile achieved in the active region of the n-channel transistors is qualitatively shown in FIG. 16. The doping profile achieved for the p-channel transistor is qualitatively shown in FIG. 17 with the same designations applying as are in FIG. 15.

It should be evident that various modifications can be made to the described embodiments without departing from the scope of the present invention.

We claim as our invention:

1. A method for the manufacture or complementary MOS field effect transistor circuits which comprises:
   providing an n$^+$-doped or p$^+$-doped silicon substrate having a first n$^-$-doped or p$^-$-doped epitaxial layer, respectively, thereon,
   implanting a comparatively high dosage of dopant into said first epitaxial layer to form highly doped buried layers,
   depositing a second epitaxial layer over said highly doped layer, and
   generating n-doped or p-doped wells by diffusion out from said highly doped epitaxial layer into said second epitaxial layer.

2. A method according to claim 1, which includes the steps of:
   implanting dopant ions into said second epitaxial layer and
   diffusing said ions from said second epitaxial layer into said n-doped or p-doped wells.

3. A method according to claim 1, wherein said first epitaxial layer has a thickness of about 3 microns and a specific resistance of about 0.5 ohms·cm; said second epitaxial layer has a thickness of about 1 micron and a specific resistance of about 20 ohms·cm; and said silicon substrate has a specific resistance of about 0.020 ohms·cm.

4. A method according to claim 1, wherein said substrate is n$^+$-doped and said first epitaxial layer is n$^-$-doped, and including the steps of:
   (a) generating a double layer consisting of SiO$_2$ and silicon nitride on said first epitaxial layer,
   (b) structuring said silicon nitride layer to provide coverage for the n-well region to be subsequently formed,
   (c) implanting a relatively large boron ion concentration in said substrate to form a highly doped buried zone, using said structured silicon nitride as a mask,
   (d) oxidizing a layer in the p-well region to be produced,
   (e) removing the silicon nitride layer and the underlying oxide in said n-well region,
   (f) depositing a second n-doped epitaxial layer over the resulting surface,
   (g) generating an insulating double layer of SiO$_2$ and silicon nitride,
   (h) implanting boron ions in the n-doped second epitaxial layer to manufacture a p-well,
   (i) exposing the substrate to a high temperature and an oxidation process,
   (j) implanting phosphorous ions to provide an n-well,
   (k) driving in the boron and phosphorous ions to form said n-well and p-well,
   (l) removing the entire surface oxide layer,
   (m) applying a silicon nitride layer over the entire active transistor regions,
   (n) implanting n-channel field oxide transistors in the region of said p-well,
   (o) forming field oxide regions by local oxidation, using said silicon nitride layer of step (m) as masking,
   (p) removing the silicon nitride masking,
   (q) thermally oxidizing the entire surface,
   (r) generating a gate oxide at a predetermined thickness,
   (s) implanting boron ions in the p-channel and n-channel to set the threshold voltage of both transistor types, and
   (t) applying gate electrodes to the transistors thus produced and generating the source/drain regions, the insulation layer, the contact holes, and the metalization in a shown manner.

5. A method according to claim 4, wherein the boron implanting of step (h) is carried out to a dosage of $2 \times 10^{12}$ cm$^{-2}$ and at an energy level of about 160 keV.

6. A method according to claim 4, wherein the phosphorous implanting of step (j) is carried out to a dosage of $1 \times 10^{12}$ cm$^{-2}$ at an energy level of about 160 keV.

7. A method according to claim 4, wherein the implanting of boron ions in step (s) is carried out with a dosage of $5 \times 10^{11}$ cm$^{-2}$ and at a dosage level of 25 keV.

8. A method for the manufacture of complementary MOS field effect transistors which comprises:
(a) providing an n+-doped silicon substrate having a first n−-doped epitaxial layer thereon,
(b) generating an insulating double layer of SiO$_2$ and silicon nitrate on said n+-doped silicon substrate,
(c) applying a photoresist mask over the region in which an n-well is to be generated,
(d) implanting a relatively high concentration of boron ions in the p-well area to be generated to form a highly doped buried layer using said photoresist mask and the silicon nitride as masking,
(e) oxidizing the surface of said p-well area for masking said area,
(f) removing the nitride layer from said n-well region,
(g) implanting a relatively large dosage of phosphorous or arsenic ions in said n-well region as to form a highly doped buried layer,
(h) etching off said masking,
(i) depositing a second epitaxial layer over the resulting surface,
(j) forming a surface-wide insulating oxide layer over the resulting surface,
(k) diffusing out the ions from said buried layers into the respective wells,
(l) masking the entire active transistor regions with a silicon nitride layer,
(m) masking the n-well regions with a photoresist layer,
(n) implanting the n-channel field oxide transistors in the region of the p-well,
(o) removing said photoresist layer,
(p) locally oxidizing the field oxide region as to form an oxide layer using said silicon nitride layer as a masking,
(q) stripping off the silicon nitride masking,
(r) thermally oxidizing the entire remaining surface,
(s) etching said oxide layer,
(t) generating a gate oxide region to a predetermined thickness,
(u) carrying out channel doping with boron ions in two steps including a deep implantation in the first step and a flat implantation in the second step, and
(v) applying gate electrodes to the gate regions and generating the source/drain regions, the insulation layer, the contact holes, and the metalitation in a known manner.

9. A method according to claim 8, wherein said implanting of boron ions takes place to a dosage of $1 \times 10^{14}$ cm$^{-2}$ at an energy level of about 25 keV.

10. A method according to claim 8, wherein the oxidizing of step (e) is carried out to a thickness of about 200 nm.

11. A method according to claim 8, which includes a step of subjecting the well regions to a high temperature treatment of about 1000° C. for two to three hours.

12. A method according to claim 8, wherein the diffusing out of step (k) is carried out at about 1000° C. for three to five hours.

13. A method according to claim 8, wherein the double layer of step (b) has an SiO$_2$ thickness of about 50 nm and a silicon nitride thickness of about 140 nm.

14. A method according to claim 8, wherein the implanting of step (n) is carried out at a boron dosage of $1 \times 10^{13}$ cm$^{-2}$ and at an energy level of 25 keV.

15. A method according to claim 8, wherein said implanting of step (g) is carried out with arsenic or phosphorous ions at a dosage of $1 \times 10^{14}$ cm$^{-2}$ and at an energy level of about 40 keV.

16. A method according to claim 8, wherein the channel doping of step (u) is carried out in the first step at a dosage of 5 to $10 \times 10^{11}$ cm$^{-2}$ and an energy level of 60 to 120 keV, and in the second step, it is carried out at a dosage level of 5 to $7 \times 10^{11}$ cm$^{-2}$ and at an energy level of about 25 keV.

* * * * *